United States Patent
Park et al.

(10) Patent No.: US 6,924,505 B2
(45) Date of Patent: Aug. 2, 2005

(54) SEMICONDUCTOR DEVICE HAVING A MEASURING PATTERN AND A METHOD OF MEASURING THE SEMICONDUCTOR DEVICE USING THE MEASURING PATTERN

(75) Inventors: Sang-Wook Park, Seoul (KR); Jae-Min Yu, Seoul (KR); Chul-Soon Kwon, Seoul (KR); Jin-Woo Kim, Suwon-si (KR); Jae-Hyun Park, Yongin-si (KR); Yong-Hee Kim, Suwon-si (KR); Don-Woo Lee, Gyeonggi-do (KR); Dai-Geun Kim, Suwon-si (KR); Joo-Chan Kim, Seoul (KR); Kook-Min Kim, Suwon-si (KR); Eui-Youl Ryu, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/858,926

(22) Filed: Jun. 2, 2004

(65) Prior Publication Data

US 2005/0035433 A1 Feb. 17, 2005

(30) Foreign Application Priority Data

Jun. 3, 2003 (KR) ................. 10-2003-0035603

(51) Int. Cl.⁷ ............................................. H01L 23/58
(52) U.S. Cl. ................. 257/48; 257/620; 257/622
(58) Field of Search ............... 257/48, 620, 622

(56) References Cited

U.S. PATENT DOCUMENTS

| | | | | |
|---|---|---|---|---|
| 5,285,082 A | * | 2/1994 | Axer | 257/48 |
| 5,903,489 A | * | 5/1999 | Hayano | 365/51 |
| 6,218,847 B1 | | 4/2001 | Matsushita | 324/716 |
| 6,822,260 B1 | * | 11/2004 | Nariman et al. | 257/48 |

FOREIGN PATENT DOCUMENTS

JP        10144635        5/1998

* cited by examiner

*Primary Examiner*—Gene M. Munson
(74) *Attorney, Agent, or Firm*—F. Chau & Associates, LLC

(57) ABSTRACT

A semiconductor device having a measuring pattern that enhances measuring reliability and a method of measuring the semiconductor device using the measuring pattern. The semiconductor device includes a semiconductor substrate having a chip area in which an integrated circuit is formed, and a scribe area surrounding the chip area. The semiconductor device also includes a measuring pattern formed in the scribe area and having a surface sectional area to include a beam area in which measuring beams are projected, and a dummy pattern formed in the measuring pattern to reduce the surface sectional area of the measuring pattern. The surface sectional area of the dummy pattern occupies from approximately 5% to approximately 15% of a surface sectional area of the beam area.

18 Claims, 5 Drawing Sheets

SEMICONDUCTOR DEVICE HAVING A MEASURING PATTERN AND A METHOD OF MEASURING THE SEMICONDUCTOR DEVICE USING THE MEASURING PATTERN

BACKGROUND OF THE INVENTION

This application claims the priority of Korean Patent Application No. 2003-35603, filed on Jun. 3, 2003, in the Korean Intellectual Property Office, the disclosure of which is incorporated herein in its entirety by reference.

1. Technical Field

The present disclosure relates to a semiconductor device having a measuring pattern and a method of measuring the semiconductor device by using the measuring pattern.

2. Discussion of the Related Art

A known manufacturing process for a semiconductor integrated circuit forms a semiconductor integrated circuit having desired functions by depositing and etching conductive and insulated layers in a multi-layer form according to a design order. It is important to monitor the thickness of each layer that is layered in the manufacturing process so as to be able to forecast characteristics of a semiconductor device or to determine the ion injection energy in a subsequent ion injection process or an etching target.

A known method measures the thickness of insulated layers formed on a conductive wire pattern using an optical and capacitance measuring instrument. The thickness of the insulated layers can depend on the density of the wire pattern having the insulated layers thereon. In addition, if a width of the wire pattern is narrow, an exact measurement may be impossible due to the occurrence of a measuring error resulting from a narrow surface area of the wire pattern. Therefore, there is provided technology to reliably measure the thickness of the insulated layers formed on the wire pattern, even in an area of the wiring pattern having low density, by using correlations between electric resistance of a wire pattern and the thickness of the insulated layers.

A measuring area is set up inside a scribe area surrounding a chip area in which the semiconductor integrated circuit is formed, and an optical measurement of each layer in the circuit is performed in the scribe area during the circuit manufacturing process.

Figure 1:
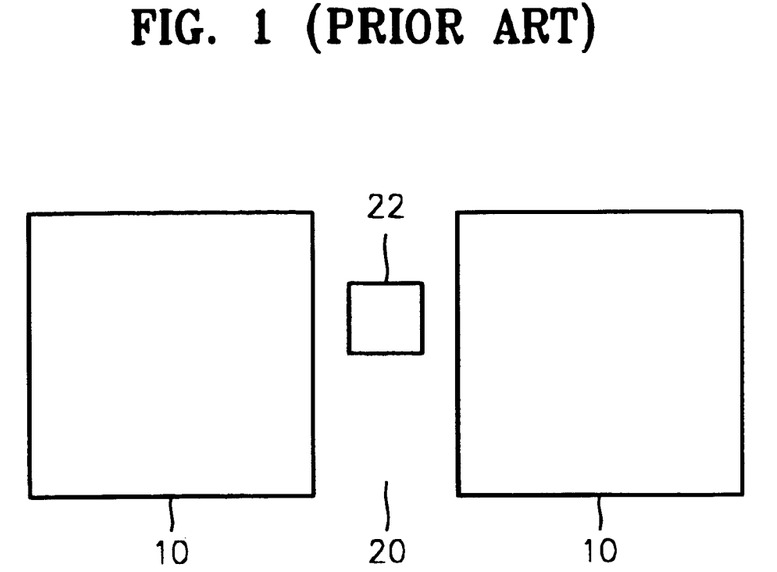
FIG. 1 is a schematic diagram illustrating a positional relationship of a chip area and a conventional measuring pattern area.

FIG. 1 is a schematic diagram illustrating a positional relationship between a chip and a measuring pattern area. Referring to FIG. 1, chip areas 10 in which the semiconductor integrated circuit is formed, are made on a semiconductor wafer, for instance, in a matrix in vertical and horizontal directions. A space between the chip areas 10 is called a scribe area 20. Each chip area 10 is separated into a unit chip along the scribe area 20. If the circuit manufacturing process is finished in each chip area 10, each unit chip is packaged in a subsequent packaging process.

A reference numeral 22 indicates a measuring pattern formed in a measuring area inside the scribe area 20. The measuring pattern 22 is formed in the same step as forming a circuit pattern of the semiconductor integrated circuit. Thus, an optical measurement on a material layer of the chip area 10 having the circuit pattern is performed on the measuring pattern 22 rather than on the circuit pattern of the chip area 10.

Figure 2:
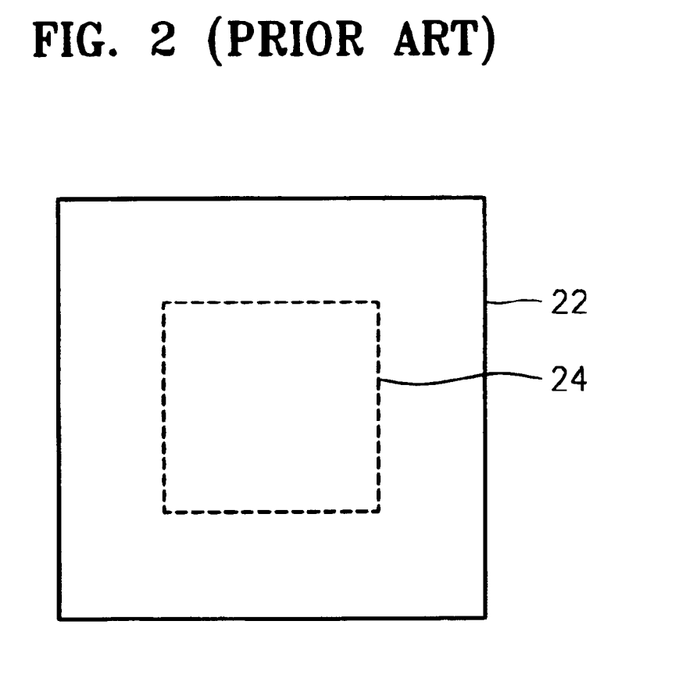
FIG. 2 is a schematic diagram illustrating a positional relationship of a conventional measuring pattern and a measuring beam area.

FIG. 2 is a schematic diagram illustrating a positional relationship of a conventional measuring pattern and a measuring beam area, and accordingly, provides an enlarged view of the measuring pattern 22 of FIG. 1.

Referring to FIG. 2, a beam area 24 indicating a reflection area of measuring beams originating from a measuring instrument is placed inside the measuring pattern 22. The measuring instrument can measure a thickness of a measured material layer by projecting light onto a target or the measured material layer. The measuring instrument may be, for example, a spectrometer or ellipsometer. A size of the beam area 24 projected onto the measured material layer from the measuring instrument is about 40 $\mu$m×40 $\mu$m. The size of the measuring pattern 22 is about 80 to approximately 100 $\mu$m×80 to approximately 100 $\mu$m.

Figure 3:
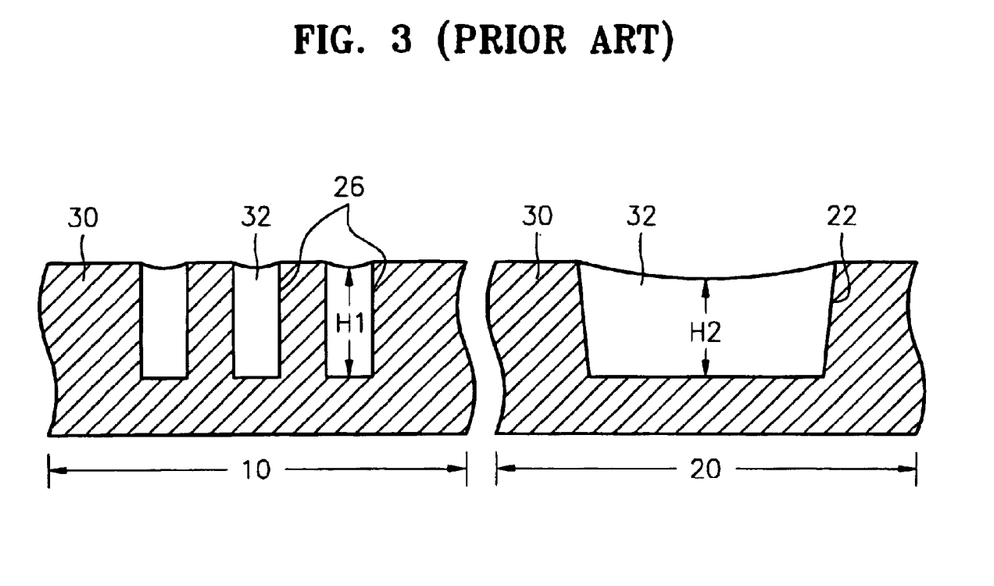
FIG. 3 is a cross-section schematically illustrating a conventional measuring pattern.

FIG. 3 is a cross-section schematically illustrating the conventional measuring pattern of FIG. 2. Referring to FIG. 3, sections of the chip area 10 in which the semiconductor integrated circuit is formed, and a scribe area 20 surrounding the chip area 10, are illustrated as being adjacent. An integrated circuit pattern 26 and the measuring pattern 22 are respectively formed in a first material layer 30 made of one of an insulated or conductive material layer formed in a step of manufacturing a single crystal silicon substrate or of manufacturing the semiconductor integrated circuit in the chip area 10.

The integrated circuit pattern 26, formed as a trench shape with a certain interval in the chip area 10, is tightly clustered as a degree of integration of the semiconductor integrated circuit increases. However, the measuring pattern 22, made as a single trench shape inside the scribe area 20, is formed to be bigger than that of the beam area 24 in FIG. 2 in order to prevent a measuring error due to misalignment of the measuring instrument. The integrated circuit pattern 26 and the measuring pattern 22 can be simultaneously formed.

Thereafter, a second material layer 32 is deposited on the whole surface of the first material layer 30 in which the integrated circuit pattern 26 and the measuring pattern 22 are formedand in the trenches formed by the integrated circuit and measuring patterns 26 and 22. Then, a portion of the second material layer 32 is removed by a chemical mechanical polishing (CMP) process to expose the surface of the first material layer 30. Thus, the second material layer 32 remains inside the trench-shaped integrated circuit pattern 26 and the measuring pattern 22.

A difference occurs in a depositing or etching process for the semiconductor integrated circuit according to the density of a pattern formed on the substrate. In addition, the removal speed differs, particularly in the CMP process, according to the size of the pattern. For example, the thickness of the second material layer 32 formed in the integrated circuit pattern 26 (H1) differs from the thickness of the second material layer 32 formed in the measuring pattern 22 (H2). While almost no dishing occurs in the second material layer 32 that is formed in the integrated circuit pattern 26 having a high density, dishing occurs considerably in the second material layer 32 formed in the measuring pattern 22 having a relatively large size. That is, the difference occurs between H1, the actual thickness of the second material layer 32 in the chip area 10, and H2, the measured thickness of the second material layer 32 in the scribe area 20. Thereby, the reliability of measuring is decreased.

Therefore, the thickness of the second material layer 32 in the measuring pattern 22 is measured in order to measure the thickness of the second material layer 32 in the integrated circuit pattern 26 inside the chip area 10. In order to correct for the difference between H1 and H2 due to dishing, the actual thickness of the second material layer 32 formed in the integrated circuit pattern 26 is checked via a transmission electronic microscope (TEM) or a vertical scanning electronic microscope (VSEM). Then, using this actual thickness, a compensation value is estimated for the second material layer 32 formed in the measuring pattern 22.

However, the second material layer 32 formed in the measuring pattern 22 that is wider than that formed in the integrated circuit pattern 26 may have a different thickness according to a wafer in different lots or even in the same lot. Thus, it is difficult to arrive at an adequate compensation value for the whole lot by relying on photos displaying a limited number of points taken by the TEM or VSEM.

Moreover, loss of wafer, human and material resources results from the use of the TEM or VSEM. In addition, considerable time is required to take the photos with the TEM or VSEM. Accordingly, substantial time is taken in obtaining and applying an adequate compensation value in a subsequent process.

SUMMARY OF THE INVENTION

A semiconductor device, according to an embodiment of the present invention, includes a semiconductor substrate including a chip area in which an integrated circuit is formed, and a scribe area surrounding the chip area, a measuring pattern formed in the scribe area and having a surface sectional area including a beam area wherein measuring beams are projected, and a dummy pattern formed in the measuring pattern for reducing the surface sectional area of the measuring pattern.

The dummy pattern may be formed of a portion of the semiconductor substrate remaining after an incomplete removal of the semiconductor substrate from the measuring pattern. The measuring pattern may further include a material layer, the material layer being a measuring target a measuring instrument outputting the measuring beams, and the chip area may include the material layer formed by the same manufacturing process as the material layer of the measuring pattern. The semiconductor substrate may include single crystal silicon and the material layer may include silicon oxide.

In addition, the surface sectional area of the measuring pattern may be at least four times larger than a surface sectional area of the beam area, and the surface sectional area of the dummy pattern may occupy from approximately 5% to approximately 15% of a surface sectional area of the beam area.

Furthermore, the dummy pattern may be disposed in various shapes such as a stripe type, an island type, and a mesh type in a predetermined direction in the measuring pattern.

A semiconductor, according to another embodiment of the present invention, includes a semiconductor substrate including a chip area in which an integrated circuit is formed, and a scribe area surrounding the chip area, a first material layer formed on the semiconductor substrate, a measuring pattern formed in the first material layer in the scribe area and having a surface sectional area including a beam area wherein measuring beams are projected, and a dummy pattern for reducing the surface sectional area of the measuring pattern.

The dummy pattern may be formed of a portion of the first material layer remaining after an incomplete removal of the first material layer from the measuring pattern. The measuring pattern may further include a second material layer, the second material layer being a measuring target of measuring instruments outputting the measuring beams, and the chip area may include the second material layer formed in the same manufacturing process as the second material layer of the measuring pattern.

The first and second material layers may have different optical characteristics, the first material layer may be a conductive material layer and the second material layer may be an insulated material layer, and the first and second material layers may be different insulated material layers.

A method of measuring a semiconductor device, according to an embodiment of the present invention, includes forming a chip area in which an integrated circuit is formed and a scribe area surrounding the chip area on a semiconductor substrate; forming an integrated circuit pattern in the chip area by etching a portion of a surface of the semiconductor substrate, forming a measuring pattern in the scribe area, wherein the measuring pattern has a surface sectional area including a beam area in which measuring beams are projected, forming a dummy pattern in the measuring pattern for reducing the surface sectional area of the measuring pattern, forming a material layer on the semiconductor substrate including the integrated circuit pattern, the measuring pattern, and the dummy pattern, etching the material layer by a predetermined thickness, and measuring the material layer formed in the measuring pattern.

Measuring the material layer formed in the measuring pattern may be performed before etching the material layer by the predetermined thickness. The method may further include etching the material layer to expose a surface of the dummy pattern. Measuring the material layer may mean measuring a thickness, sheet resistance or a refractive index of the material layer.

A method of measuring a semiconductor device, according to an embodiment of the present invention, includes forming a chip area in which an integrated circuit is formed and a scribe area surrounding the chip area on a semiconductor substrate, forming a first material layer on the semiconductor substrate, forming an integrated circuit pattern in the chip area by etching a portion of the first material layer, forming a measuring pattern in the first material layer in the scribe area, wherein a surface sectional area including a beam area in which measuring beams are projected, forming a dummy pattern in the measuring pattern for reducing the surface sectional area of the measuring pattern, forming a second material layer on the semiconductor substrate including the first material layer, the semiconductor integrated circuit pattern, the measuring pattern, and the dummy pattern, etching the second material layer by a predetermined thickness, and measuring the second material layer formed in the measuring pattern.

As a result, dishing of the measuring pattern can be prevented and a more reliable measurement can be obtained by forming a dummy pattern exposed within a certain scope in the beam area projected inside the measuring pattern.

BRIEF DESCRIPTION OF THE DRAWINGS

Preferred embodiments of the invention can be understood in more detail from the following descriptions taken in conjunction with the accompanying drawings in which.

DETAILED DESCRIPTION OF THE PREFERRED EMBODIMENTS

Preferred embodiments of the present invention will be described below in more detail with reference to the accompanying drawings. This invention may, however, be embodied in many different forms and should not be construed as being limited to the embodiments set forth herein; rather these embodiments are provided so that this disclosure will be thorough and complete and will fully convey the scope of the invention to those skilled in the art.

Figure 4:
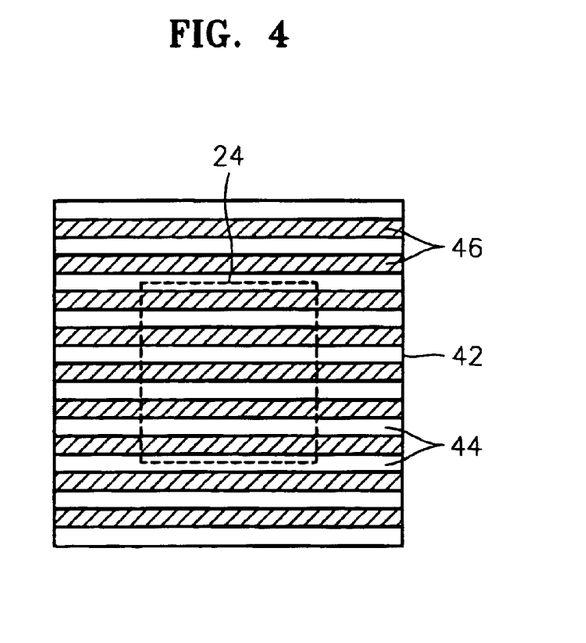
FIG. 4 is a schematic diagram illustrating a positional relationship of a measuring pattern and a measuring beam area according to an embodiment of the present invention.
Figure 5:
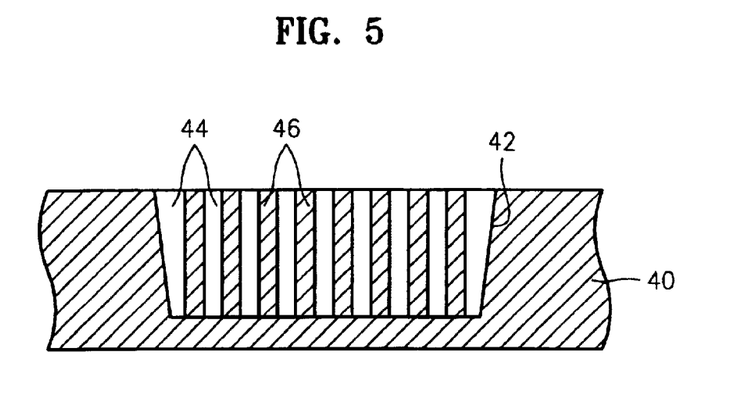
FIG. 5 is a cross-section of a measuring pattern according to an embodiment of the present invention.

FIG. 4 is a schematic diagram illustrating a positional relationship of a measuring pattern and a measuring beam area according to an embodiment of the present invention. FIG. 5 is a cross-section of a measuring pattern according to an embodiment of the present invention.

Referring to FIGS. 4 and 5, a measuring pattern 42 is formed in a square trench shape in a first material layer 40 inside a scribe area 20, similar in shape to the measuring pattern 22 displayed in FIGS. 1–3. However, unlike the measuring pattern 22 displayed in FIGS. 1–3, a plurality of dummy patterns 46 disposed with a certain interval and having a stripe shape are further formed in the measuring pattern 42.

The first material layer 40 may be a single crystal silicon substrate, an insulated material layer including an oxide or nitride substance, or a conductive layer including metal or polysilicon formed in a step of a process for manufacturing a semiconductor integrated circuit on a single crystal silicon wafer.

The dummy pattern 46 is formed via a predetermined photo etching process in the same step as forming the semiconductor integrated circuit inside the chip area. After depositing a second material layer 44 made of a material such as silicon oxide and having different optical characteristics from the first material layer 40, on the whole surface of and in a substrate in which the dummy pattern 46 is formed, a surface of the first material layer 40 is exposed by an etch-back process. The etch-back process according to an embodiment of the present invention is performed by a chemical mechanical polishing (CMP) method. As shown in FIG. 5, dishing of the second material layer 44, unlike the second material layer 32 in FIG. 3, does not occur since the dummy pattern 46 is included in the measuring pattern 42.

A surface sectional area of the measuring pattern 42 in FIG. 4 is formed to have a sufficient margin so that a measuring error does not occur in the beam area 24, wherein beams from the measuring instrument are reflected due to misalignment of the measuring instrument. For instance, even if the integrity of the semiconductor integrated circuit formed in the chip area is increased and a design rule is decreased, the surface sectional area of the measuring pattern 42 is made to be at least four times bigger than that of the beam area 24, which is a measuring limit of the measuring instrument. According to the present embodiment, the size of the surface sectional area of the beam area 24 of the measuring instrument is formed to be about 40 μm×40 μm, and the size of the surface sectional area of the measuring pattern 42 is made to be about 80 to approximately 100 μm×about 80 to approximately 100 μm. In this case, the surface sectional area of the measuring pattern 42 is 4 or 6.25 times bigger than that of the beam area 24.

The second material layer 44, or the measured material layer, and the dummy pattern 46 are exposed together in the beam area 24 shown in FIG. 4, wherein beams from the measuring instrument are reflected. Thus, an actual measured value includes not only a value measured from a surface of the second material layer 44, but also a value measured from the surface of the dummy pattern 46. A thickness measuring instrument used in the present embodiment is a spectrometer that measures the thickness of the measured material layer by an intensity ratio of a reflected beam to a projected beam. With this instrument, reliable data can be obtained if a ratio of the surface sectional area of the dummy pattern 46 to the overall surface sectional area of the beam area 24 ("dummy pattern ratio") is maintained at a certain level so that an intensity ratio of a reflected beam to a projected beam with respect to the surface of the dummy pattern 46 can be ignored.

A result of measuring the thickness of the second material layer 44 is illustrated in Table 1 below according to the ratio of the surface sectional area of the dummy pattern 46 to the beam area 24.

TABLE 1

| Sample No. | Measured thickness value (Å) | Pattern size (A × B) (μm) | Goodness of fit (GOF) | Dummy pattern ratio (%) |
|---|---|---|---|---|
| 1 | 4,457 | 3 × 0.4 horizontal pattern | 0.7 | 11.25 |
| 2 | 4,412 | 3 × 0.4 vertical pattern | 0.7 | 11.25 |
| 3 | 4,402 | 5 × 0.4 horizontal pattern | 0.9 | 6.80 |
| 4 | 4,361 | 5 × 0.4 vertical pattern | 0.9 | 6.80 |
| 5 | NA | 1 × 0.4 horizontal pattern | 0.3 | 27.50 |
| 6 | NA | 1 × 0.4 vertical pattern | 0.3 | 27.50 |

The thickness of the second material layer 44 that is actually measured in the chip area is approximately 4,400 Å. In a case where the conventional measuring pattern 22 is without the dummy pattern (or when the dummy pattern ratio is 0%) as illustrated in FIG. 2, the measured thickness is approximately 3,000 to approximately 3,500 Å, and in a case where the dummy pattern ratio is about 6.80 to approximately 11.25%, the measured thickness approaches 4400 Å as shown in Table 1. In a case where the dummy pattern ratio is about 27.50%, it is impossible to measure the thickness since it is not within a measurable scope of the measuring instrument. This immeasurability is caused by an influence of the beams reflected from the surface of the dummy pattern 46.

The measured thickness value in Table 1 is measured in the beam area 24 inside the measuring pattern 42, and the pattern size is expressed as A×B, where "A" indicates a width (μm) of the second material layer 44 placed between a plurality of dummy patterns and "B" indicates a width (μm) of each dummy pattern 46. With respect to the pattern size, if the stripe-typed dummy pattern 46 is formed horizontally, it is dubbed as "horizontal", however, if it is formed vertically, it is dubbed as "vertical". A goodness of fit (GOF) indicating a parameter which can influence a reliability level of measured data is expressed from 0 to 1 by analyzing a wavelength spectrum applied to the measured material layer. As this value approaches 1, the data reliability level increases. If the GOF value is 0.6 or lower, the measured data may be considered unreliable. As indicated above, the dummy pattern ratio indicates the ratio of the surface sectional area of the dummy pattern 46 to the overall surface sectional area of the beam area 24.

Figure 8:
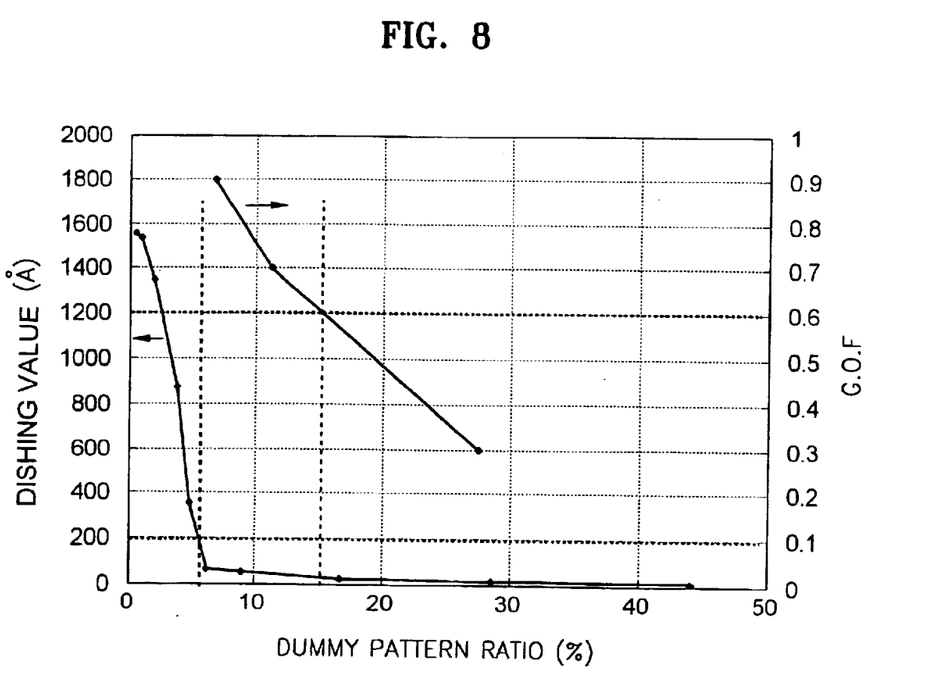
FIG. 8 is a graph measuring a dishing value and a goodness of fit (GOF) based on a dummy pattern ratio according to an embodiment of the present invention.

FIG. 8 is a graph measuring a dishing value and a goodness of fit (GOF) based on a dummy pattern ratio according to an embodiment of the present invention. Referring to FIG. 8, a horizontal axis shows the dummy pattern ratio, a vertical axis on the right side displays the GOF value, and a vertical axis on the left side shows a dishing value. The dishing value is the difference between the thickness measured in the chip area 10 and in the beam area 24. If the dishing value is 200 Å or more, like when the conventional measuring pattern without the dummy pattern is used, the thickness measured in the beam area 24 cannot substitute for the actual thickness in the chip area 10. As shown in FIG. 8, the dummy pattern ratio having a value in the range of approximately 5 to approximately 15% corresponds to a GOF value of 0.6 or higher, and a dishing value of 200 Å or lower.

Figure 6A:
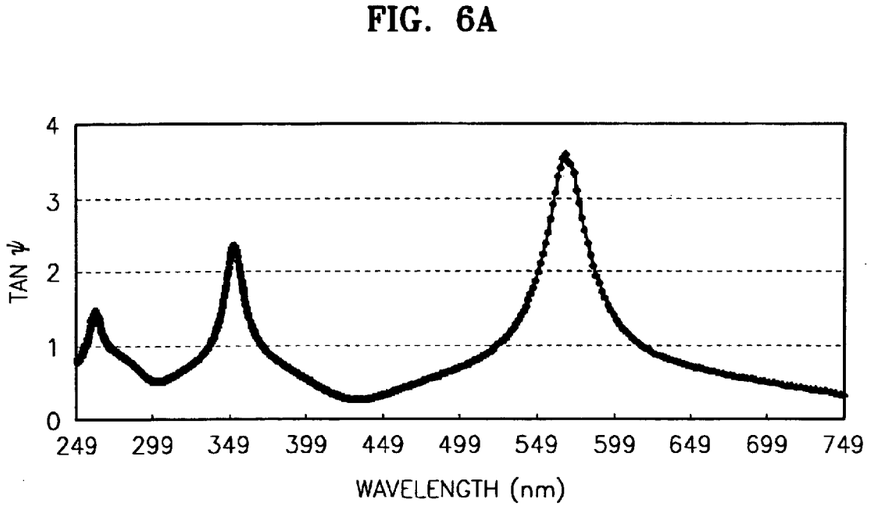
FIG. 6A is a graph illustrating a tan Ψ spectrum according to a wavelength range applied to a standard silicon oxide film.
Figure 6B:
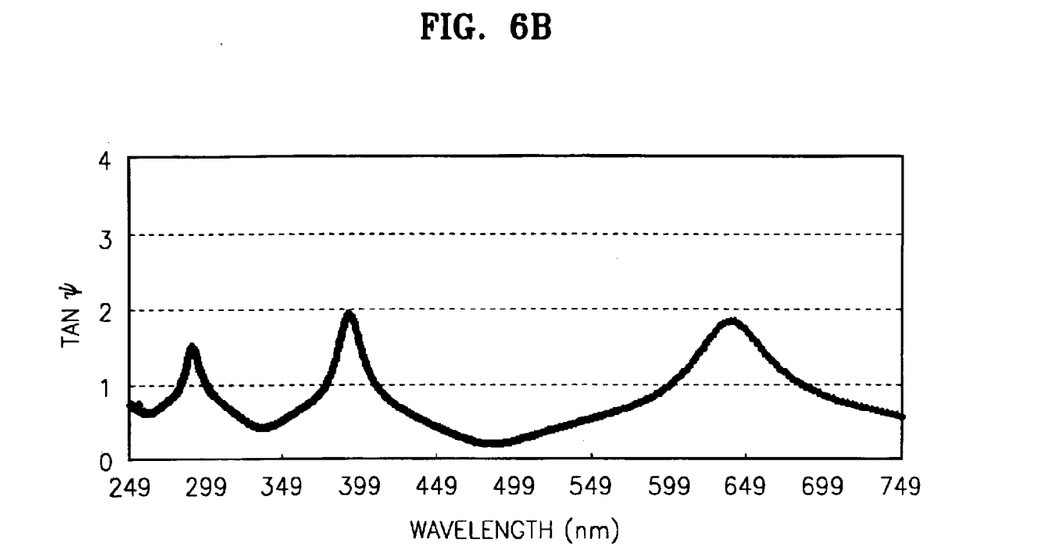
FIG. 6B is a graph illustrating a tan Ψ spectrum according to a wavelength range applied to a sample of an embodiment of the present invention.

FIG. 6A is a graph illustrating a tan Ψ spectrum according to a wavelength range applied to a standard oxide film, and FIG. 6B is a graph illustrating a tan Ψ spectrum according to a wavelength range applied to a sample of an embodiment of the present invention. In addition, FIG. 7A is a graph illustrating a cos Δ spectrum according to a wavelength range applied to a standard oxide film, and FIG. 7B is a graph illustrating a cos Δ spectrum according to a wavelength range applied to a sample of an embodiment of the present invention.

A spectroscopic ellipsometer (SE), a thickness measuring instrument, projects and reflects polarized multi-wavelength light as a fan shape to a wafer through a rotating polarizer. Then, the projected and reflected light enters into a prism through the fixed polarizer. When the fan-shaped polarized light is reflected by the wafer, it usually takes an oval form. The projected beam can be divided into a p beam polarized parallel to a plane formed by the projected and reflected beam and an s beam polarized perpendicular to the plane. These elements have complex and mutually different intensities and phase differences. The expression tan Ψ is defined as an intensity ratio of the reflected p and s elements and Δ is defined as the phase difference of the p and s elements. Cos Δ means exp (iΔ) and tan Ψ and cos Δ indicate film characteristics along a spectrum.

Figure 7A:
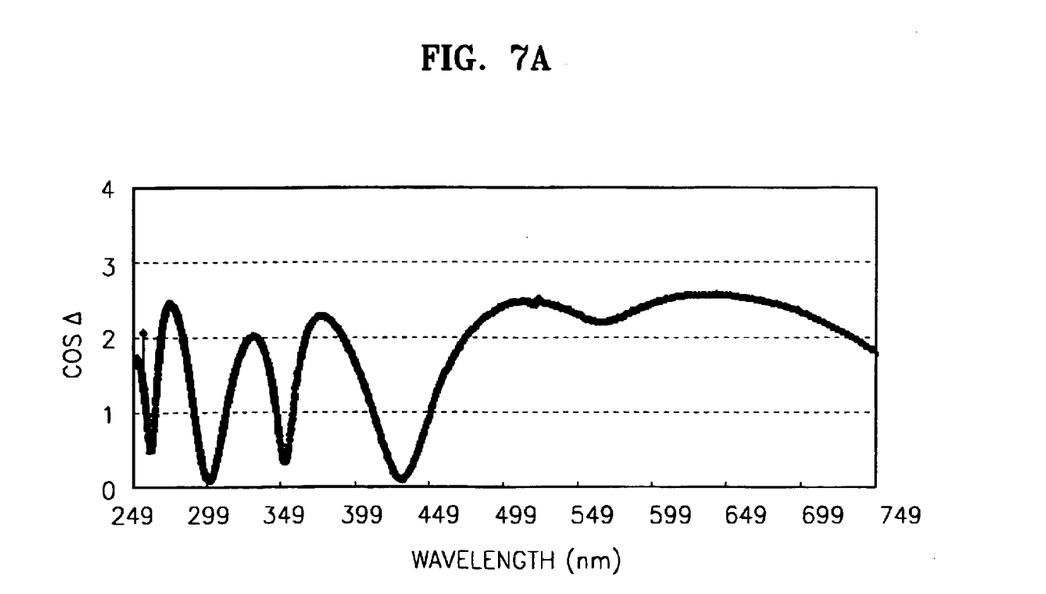
FIG. 7A is a graph illustrating a cos Δ spectrum according to a wavelength range applied to a standard silicon oxide film.
Figure 7B:
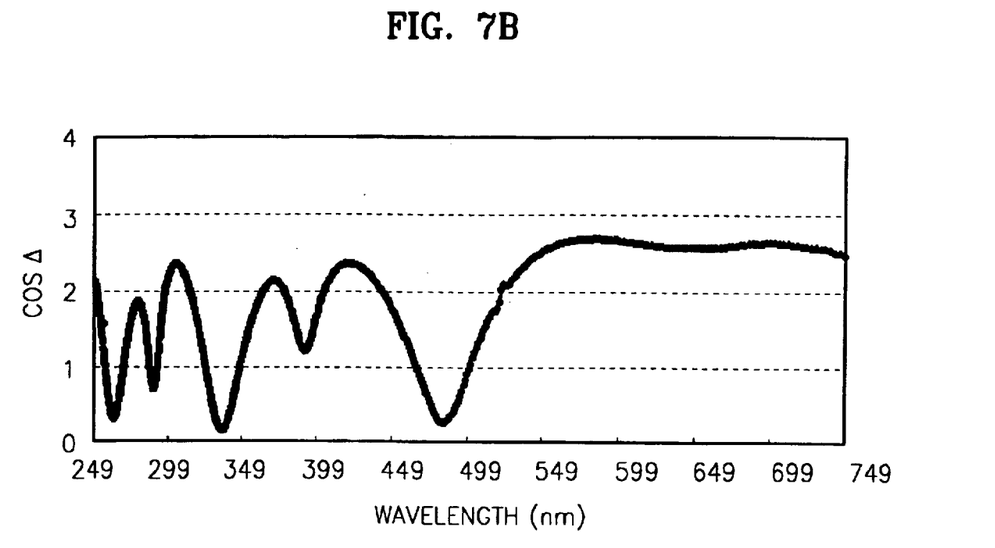
FIG. 7B is a graph illustrating a cos Δ spectrum according to a wavelength range applied to a sample of an embodiment of the present invention.

FIGS. 6A and 7A respectively represent tan Ψ and cos Δ according to a wavelength range applied to a standard silicon oxide film and FIGS. 6B and 7B respectively indicate tan Ψ and cos Δ according to a wavelength range applied to Sample No. 3 from Table 1 above. As seen from Table 1, Sample No. 3 had the highest reliability. FIGS. 6A and 6B and FIGS. 7A and 7B illustrate a similar spectrum profiles. In spite of the existence of the dummy pattern 46, the similar spectrum profiles show that if the surface sectional area of the dummy pattern 46 is maintained within a certain level, the thickness of the measured material inside the chip area 10 is reliably obtained by measuring the measuring pattern 42.

The dummy pattern 46 is formed to be a stripe type according to an embodiment of the present invention; however, the dummy pattern 46 can be formed in various configurations, such as an island type, mesh type, cross type, or a closed curve type. Moreover, an embodiment of the present invention explains measuring the silicon oxide film in a case where the measuring pattern is formed in the single crystal silicon layer and the silicon oxide film is formed in the measured pattern. However, the material of the measuring pattern, including the dummy pattern and the measured material layer to be measured by the measuring instrument, can be applied to various cases according to the manufacturing process of the semiconductor integrated circuit. The measuring method of the thickness of the measured material layer can also be applied to measure sheet resistance or a refractive index of the measured material layer.

As a result, regardless of a decline of the design rule, the measuring pattern corresponding to the beam size in the measuring instrument is formed to have a sufficient size in the scribe area, which is detached from the chip area, and the measuring reliability is enhanced by preventing dishing in the measuring pattern using the dummy pattern.

Although the illustrative embodiments have been described herein with reference to the accompanying drawings, it is to be understood that the present invention is not limited to those precise embodiments and that various other changes and modifications may affected therein by one of ordinary skill in the related art without departing from the spirit or scope of the invention. All such changes and modifications are intended to be included within the scope of the invention as defined by the appended claims.

What is claimed is:

1. A semiconductor device, comprising:
   a semiconductor substrate including a chip area in which an integrated circuit is formed, and a scribe area surrounding the chip area;
   a measuring pattern formed in the scribe area and having a surface sectional area including a beam area wherein measuring beams are projected; and
   a dummy pattern formed in the measuring pattern for reducing the surface sectional area of the measuring pattern.

2. The semiconductor device of claim 1, wherein the dummy pattern is formed of a portion of the semiconductor substrate remaining after an incomplete removal of the semiconductor substrate from the measuring pattern.

3. The semiconductor device of claim 1, wherein the measuring pattern further includes a material layer, the material layer being a measuring target a measuring instrument outputting the measuring beams, and the chip area includes the material layer formed by the same manufacturing process as the material layer of the measuring pattern.

4. The semiconductor device of claim 3, wherein the semiconductor substrate includes single crystal silicon and the material layer includes silicon oxide.

5. The semiconductor device of claim 1, wherein the surface sectional area of the measuring pattern is at least four times larger than a surface sectional area of the beam area.

6. The semiconductor device of claim 1, wherein a portion of the dummy pattern is included in the beam area.

7. The semiconductor device of claim 6, wherein a surface sectional area of the dummy pattern occupies from approximately 5% to approximately 15% of a surface sectional area of the beam area.

8. The semiconductor device of claim 1, wherein the dummy pattern is disposed as a stripe type in a predetermined direction in the measuring pattern.

9. A semiconductor device, comprising:
- a semiconductor substrate including a chip area in which an integrated circuit is formed, and a scribe area surrounding the chip area;
- a first material layer formed on the semiconductor substrate;
- a measuring pattern formed in the first material layer in the scribe area and having a surface sectional area including a beam area wherein measuring beams are projected; and
- a dummy pattern for reducing the surface sectional area of the measuring pattern.

10. The semiconductor device of claim 9, wherein the dummy pattern is formed of a portion of the first material layer remaining after an incomplete removal of the first material layer from the measuring pattern.

11. The semiconductor device of claim 9, wherein the measuring pattern further includes a second material layer, the second material layer being a measuring target of measuring instruments outputting the measuring beams, and the chip area includes the second material layer formed in the same manufacturing process as the second material layer of the measuring pattern.

12. The semiconductor device of claim 11, wherein the first material layer and the second material layer have different optical characteristics.

13. The semiconductor device of claim 11, wherein the first material layer is a conductive material layer and the second material layer is an insulated material layer.

14. The semiconductor device of claim 11, wherein the first material layer and the second material layer are different insulated material layers.

15. The semiconductor device of claim 9, wherein the surface sectional area of the measuring pattern is at least four times larger than a surface sectional area of the beam area.

16. The semiconductor device of claim 9, wherein a portion of the dummy pattern is included in the beam area.

17. The semiconductor device of claim 16, wherein a surface sectional area of the dummy pattern occupies from approximately 5% to approximately 15% of a surface sectional area of the beam area.

18. The semiconductor device of claim 9, wherein the dummy pattern is deposited as a stripe type in a predetermined direction in the measuring pattern.

* * * * *